United States Patent
Fischer et al.

(10) Patent No.: US 7,328,302 B2
(45) Date of Patent: Feb. 5, 2008

(54) DEVICE AND METHOD FOR TREATING A STATE OF A MEMORY

(75) Inventors: Wieland Fischer, Munich (DE); Christian Samec, Graz (AT)

(73) Assignee: Infineon Technologies AG (DE)

( * ) Notice: Subject to any disclaimer, the term of this patent is extended or adjusted under 35 U.S.C. 154(b) by 259 days.

(21) Appl. No.: 11/267,027

(22) Filed: Nov. 3, 2005

(65) Prior Publication Data

US 2006/0218339 A1 Sep. 28, 2006

Related U.S. Application Data

(63) Continuation of application No. PCT/EP2004/004146, filed on Apr. 19, 2004.

(30) Foreign Application Priority Data

May 20, 2003 (DE) ............... 103 22 723

(51) Int. Cl.
*G06F 12/00* (2006.01)
(52) U.S. Cl. ............ 711/103; 711/156; 714/5; 714/54
(58) Field of Classification Search ......... 711/103, 711/156; 714/5, 54
See application file for complete search history.

(56) References Cited

U.S. PATENT DOCUMENTS

| | | | |
|---|---|---|---|
| 5,715,431 A | 2/1998 | Everett et al. | |
| 5,826,001 A * | 10/1998 | Lubbers et al. | 714/6 |
| 5,963,473 A | 10/1999 | Norman | |
| 6,005,810 A | 12/1999 | Wu | |
| 6,304,486 B1 | 10/2001 | Yano | |
| 2002/0069313 A1 | 6/2002 | Douniwa et al. | |

FOREIGN PATENT DOCUMENTS

DE    100 37 037 A1    6/2001

\* cited by examiner

*Primary Examiner*—Matthew Kim
*Assistant Examiner*—Hetul Patel
(74) *Attorney, Agent, or Firm*—Dickstein, Shapiro, LLP.

(57) ABSTRACT

Device for treating a memory state resulting from incomplete writing or erasing of data. The memory includes memory cells organized in a plurality of pages each having generation information indicating a programming time of the page. A unit determines generation information from the generation information of the plurality of pages to obtain determined generation information indicating a programming time which is not the oldest programming time. A page determination unit determines a page including an inconsistency from the plurality of pages to obtain a determined page. A selection unit selects a further page, a marking unit marks the further page to obtain a marked page, and a providing unit provides new generation information based on the determined generation information. A reading unit reads data from the marked page and a writing unit writes the data read from the marked page and the new generation information to the determined page.

20 Claims, 2 Drawing Sheets

DEVICE AND METHOD FOR TREATING A STATE OF A MEMORY

CROSS-REFERENCE TO RELATED APPLICATION

This application is a continuation of copending International Application No. PCT/EP2004/004146, filed on Apr. 19, 2004, which designated the United States and was not published in English.

BACKGROUND OF THE INVENTION

1. Field of the Invention

The present invention relates to a device and a method for treating a state of a memory with memory cells organized in a plurality of pages resulting from incomplete writing or erasing of data, wherein the memory is particularly a UCP EEPROM (uniform channel programming electrically erasable read only memory).

2. Description of the Related Art

Electrically erasable programmable read only memories (EEPROMs) are used for a number of applications to store data in a non-volatile way, or also after turning off a supply-power. A sub-class of the EEPROMs is the UCP EEPROM. In order to save chip area and thus reduce manufacturing costs, bit/byte switches are omitted in a UCP EEPROM, among other things. The memory is organized in pages. One page consists of a number of bytes or words, wherein one word may, for example, include 32 bits. One page consists, for example, of 64 bytes. In the UCP concept, no individual bits or bytes can be erased individually within a page, i.e. for example be set to 0, depending on the definition. Programming of individual bits or bytes is also limited. Instead, programming and erasing is done pagewise, i.e. all bits of the page are written or erased in parallel and simultaneously. In the following, it is assumed that a bit is set to 0 when erasing, and is pulled to 1 when programming, if necessary.

The considerable advantage of saving chip area is opposed by the disadvantage that a whole page must be erased and then re-programmed even if only one single bit is to be changed. For changing the page, it must be buffered from, at the latest, before the start of the erasing to at least after completing the writing. This buffering occurs in a (volatile) RAM cell field (RAM=random access memory) or also in a (non-volatile) EEPROM cell field. The buffering in an EEPROM cell field has the advantage that the buffered data are not lost, not even in the case of a failure of the supply power during erasing or writing.

A widespread architecture is one where a number (for example 32) of pages are combined to a sector. In this example, a sector S includes pages P1, . . . , P32. In order to avoid the need of buffering a page (in the case of a non-volatile buffering, this corresponds to an EEPROM programming process) prior to erasing it, a further page is added to the sector, which, in the following, will be referred to as P0. The additional page P0 is initially in an erased state. In order to change one of the pages P1, . . . , P32, its data content including the changes is programmed into the page P0. After that, the old page is erased and the page P0, now containing the updated data, is mapped into the memory. The erased page now takes over the role originally occupied by the page P0. The respective erased extra page is called spare page.

In the described programming process for changing a page, pages in the sector are scrambled, i.e. the association of physical pages with logical pages is arbitrary and changes with every programming process. In order to identify the physical pages and/or guarantee their association with logical pages and/or memory addresses within a memory address space of the sector, each page has some additional bits forming the so-called map and/or association block. This association block has the map and/or association address in each page. It indicates which memory addresses the physical page corresponds to. To stick to the numerical example above, there is an integer between 1 and 32 or, more practicable, between 0 and 31 in the association block of each page and indicates the position of the page in the memory space and/or address space of the sector. So there is one erased page and/or spare page and 32 data pages and/or pages with data content within a sector.

Looking at the 32 association blocks of the 32 data pages, you will find every integer between 1 and 32 (or better: between 0 and 31) exactly once, and it is uniquely established which memory address each physical page corresponds to. The association block includes non-volatile memory cells so that the association of the physical pages with memory addresses is not lost, not even in the case of a reset process or a loss of current and/or a failure of the power supply. The association block is, for example, integrated in the plurality of the EEPROM cells of the page.

In the described UCP concept, each programming process of a page also somewhat disturbs the pages which are not the target of the programming process. Therefore, a programming process is also referred to as disturb. Each disturb changes the analog state of a memory cell. After a large number of disturbs, the memory cell then has a changed digital state. This is equivalent to a loss and/or corruption of the stored information. In order to prevent this consequence of a too large number of disturbs, each page is provided with a time stamp when it is written. The time stamp is the current value of a counter at the time of writing the page, the counter also being referred to as disturb counter. The time stamp is deposited, for example, in or at the association block. When a page ages, i.e. is exposed to a growing number of disturbs, the time stamp will be more and more remote from the current value of the counter. The current value, in turn, is equal to the maximum of all 32 time stamps present. When the difference between the time stamp of a page and the current value of the counter exceeds a predetermined threshold, the page is re-programmed to avoid excessive ageing.

A loss of information or data stored in an EEPROM is disadvantageous for several reasons. On the one hand, a loss of data is undesirable per se in most cases, because it may have unpredictable and often serious consequences. In the case of an EEPROM on a chip card, a loss of data may further, for example, result in an unwanted enabling of functions or performance features. Furthermore, a loss of data is usable for an attack for decrypting cryptographic features, for example of a chip card. Certain parties therefore have an interest in causing a loss of data of an EEPROM on a chip card.

One possibility of causing a loss of data is to interrupt the current supply and/or the power supply repeatedly during a programming process and/or during the writing of a new page and the subsequent erasing of the old page. This intervention is also called tearing. Tearing may cause two problems.

A. The power supply fails during the writing of the new page or during the erasing of the old page. This results in the presence of a page containing invalid data, because some bits are already toggled in the right direction and/or are already programmed, while others still comprise the original content. This may, for example, be detected by means of an error correcting code. As a result, the invalid page is erased.

B. The tearing occurs after the new page has been written and before the old page has been erased and/or after all bits of the new page to be programmed to 1 have been toggled from 0 to 1 and before the first bits of the old page programmed with the value 1 toggle from 1 to 0. As a consequence, a page exists twice and/or two physical pages have the same association address in their association blocks. In this case, one of the two pages is erased, preferably the page identified as the older one by means of the time stamp.

In the case of a tearing or another failure of the supply power during the writing of the new page, the write operation generates a disturb disturbing the other pages. If, as described at A, the incompletely written and thus invalid page is now erased, the old page with the unchanged data is preserved, but the sector does not contain any page with the time stamp incremented corresponding to the write operation. The information of the disturb is thus present in the form of a small, accumulatable disturb of the memory cells in the rest of the chip. However, the time stamp of the incompletely written new page which gives an incremented disturb count is lost. In order to introduce the information on the number of the disturbs into the sector, a time stamp incremented with respect to the maximum of the time stamps of the pages of the sector has to be introduced afterwards into any page of the sector. But an attacker could turn off the power supply again at that moment. In that case, the information on the disturb would be irretrievably lost. In this way, an attacker could introduce many (any number of) disturbs into a sector, without the system being able to detect it. The result is a loss of data which may be used for an attack for the decryption of cryptographic functions.

SUMMARY OF THE INVENTION

It is an object of the present invention to provide a method and a device for treating a state of a memory resulting from incomplete writing or erasing of data.

In accordance with a first aspect, the present invention provides a device for treating a state, resulting from incomplete writing or erasing of data, of a memory having memory cells organized in a plurality of pages with which there is respectively associated generation information indicating a programming time of the page, the device having a unit for determining generation information from the generation information of the plurality of pages to obtain determined generation information, wherein the determined generation information indicates a programming time of the plurality of pages which is not the oldest programming time; a page determination unit for determining a page from the plurality of pages which includes an inconsistency to obtain a determined page; a selection unit for selecting a further page from the plurality of pages to obtain a selected page; a marking unit for marking the selected page to obtain a marked page; a providing unit for providing new generation information based on the determined generation information; a reading unit for reading data from the marked page; and a writing unit for writing the data read from the marked page and the new generation information to the determined page.

In accordance with a second aspect, the present invention provides a memory having a plurality of pages, each having memory cells for storing data and generation information associated with the page; and a device for treating a state, resulting from incomplete writing or erasing of data, of a memory having memory cells organized in a plurality of pages with which there is respectively associated generation information indicating a programming time of the page, the device having a unit for determining generation information from the generation information of the plurality of pages to obtain determined generation information, wherein the determined generation information indicates a programming time of the plurality of pages which is not the oldest programming time; a page determination unit for determining a page from the plurality of pages which includes an inconsistency to obtain a determined page; a selection unit for selecting a further page from the plurality of pages to obtain a selected page; a marking unit for marking the selected page to obtain a marked page; a providing unit for providing new generation information based on the determined generation information; a reading unit for reading data from the marked page; and a writing unit for writing the data read from the marked page and the new generation information to the determined page.

In accordance with a third aspect, the present invention provides A method for treating a state, resulting from incomplete writing or erasing of data, of a memory having memory cells organized in a plurality of pages, wherein each page has generation information indicating a programming time of the page, the method having the steps of determining generation information from the generation information of the plurality of pages to obtain determined generation information, wherein the determined generation information indicates a programming time of the plurality of pages which is not the oldest programming time; determining a page from the plurality of pages which includes an inconsistency to obtain a determined page, wherein the inconsistency results from the incomplete writing or erasing of data; selecting a further page from the plurality of pages to obtain a selected page; marking the further page to obtain a marked page; providing new generation information based on the determined generation information; reading data from the marked page; and writing the data read from the marked page and the new generation information to the determined page.

In accordance with a fourth aspect, the present invention provides a method for treating a state, resulting from incomplete erasing of a page of a memory, of a memory having memory cells organized in a plurality of pages, each page being associated with generation information indicating a programming time of the page and having a marking bit, the method having the steps of determining a page whose marking bit is set; determining generation information from the generation information of the plurality of pages to obtain determined generation information, wherein the determined generation information indicates a programming time of the plurality of pages which is not the oldest programming time; determining a page including an inconsistency to obtain a determined page, wherein the inconsistency results from the incomplete erasing of data; providing new generation information based on the determined generation information; erasing the page including an inconsistency; reading data from the marked page; and writing the data read from the marked page and the new generation information to the determined page including the inconsistency.

In accordance with a fifth aspect, the present invention provides a method for treating a state, resulting from incomplete writing or erasing of data, of a memory having memory cells organized in a plurality of pages, wherein each page has generation information indicating a programming time of the page, and wherein each page has a first marking bit and a second marking bit indicating the incomplete writing or erasing, the method having the steps of determining a marked page whose second marking bit is set; determining generation information from the generation information of the plurality of pages to obtain determined generation information, wherein the determined generation information indicates a programming time of the plurality of pages which is not the oldest programming time; determining a page including an inconsistency to obtain a determined page, wherein the inconsistency results from the incomplete writing or erasing of data; providing new generation information based on the determined generation information; reading data from the marked page whose second marking bit is set; writing the data read from the marked page whose second marking bit is set and the new generation information to the determined page; setting the first marking bit of the determined page; providing further new generation information based on the new generation information; reading data from the determined page after writing the data read from the marked page whose second marking bit is set to the determined page and after setting the first marking bit; writing the data read from the determined page and the further new generation information to the marked page whose second marking bit is set.

In accordance with a sixth aspect, the present invention provides a computer program with a program code for performing a method for treating a state, resulting from incomplete writing or erasing of data, of a memory having memory cells organized in a plurality of pages, wherein each page has generation information indicating a programming time of the page, when the program runs on a computer, the method having the steps of determining generation information from the generation information of the plurality of pages to obtain determined generation information, wherein the determined generation information indicates a programming time of the plurality of pages which is not the oldest programming time; determining a page from the plurality of pages which includes an inconsistency to obtain a determined page, wherein the inconsistency results from the incomplete writing or erasing of data; selecting a further page from the plurality of pages to obtain a selected page; marking the further page to obtain a marked page; providing new generation information based on the determined generation information; reading data from the marked page; and writing the data read from the marked page and the new generation information to the determined page.

In accordance with a seventh aspect, the present invention provides a computer program with a program code for performing a method for treating a state, resulting from incomplete erasing of a page of a memory, of a memory having memory cells organized in a plurality of pages, each page being associated with generation information indicating a programming time of the page and having a marking bit, when the program runs on a computer, the method having the steps of determining a page whose marking bit is set; determining generation information from the generation information of the plurality of pages to obtain determined generation information, wherein the determined generation information indicates a programming time of the plurality of pages which is not the oldest programming time; determining a page including an inconsistency to obtain a determined page, wherein the inconsistency results from the incomplete erasing of data; providing new generation information based on the determined generation information; erasing the page including an inconsistency; reading data from the marked page; and writing the data read from the marked page and the new generation information to the determined page including the inconsistency.

In accordance with an eighth aspect, the present invention provides a computer program with a program code for performing a method for treating a state, resulting from incomplete writing or erasing of data, of a memory having memory cells organized in a plurality of pages, wherein each page has generation information indicating a programming time of the page, and wherein each page has a first marking bit and a second marking bit indicating the incomplete writing or erasing, when the program runs on a computer, the method having the steps of determining a marked page whose second marking bit is set; determining generation information from the generation information of the plurality of pages to obtain determined generation information, wherein the determined generation information indicates a programming time of the plurality of pages which is not the oldest programming time; determining a page including an inconsistency to obtain a determined page, wherein the inconsistency results from the incomplete writing or erasing of data; providing new generation information based on the determined generation information; reading data from the marked page whose second marking bit is set; writing the data read from the marked page whose second marking bit is set and the new generation information to the determined page; setting the first marking bit of the determined page; providing further new generation information based on the new generation information; reading data from the determined page after writing the data read from the marked page whose second marking bit is set to the determined page and after setting the first marking bit; writing the data read from the determined page and the further new generation information to the marked page whose second marking bit is set.

BRIEF DESCRIPTION OF THE DRAWINGS

In the following, preferred embodiments of the present invention will be explained in more detail with respect to the accompanying drawings, in which.

DESCRIPTION OF THE PREFERRED EMBODIMENTS

The present invention is based on the idea to treat or repair a state of a memory and/or a sector of a memory resulting from incomplete writing or erasing of data so that no information on the disturbs is lost at any time. For this purpose, the beginning and other stations of the method also referred to as tearing service are marked by post-programming of already existent pages. By doing this, it is possible to detect at any time and even after another tearing that and at which place the tearing service was interrupted.

The starting point of the inventive tearing service is the determination of a page including an inconsistency. In the case A described above, this is an invalid page and/or a page with an inconsistency between its data content and its error correcting code. In the case B described above, the inconsistent page is a page that has the same logical address as another page in its association block, but has an older time stamp than the same. The page comprising the inconsistency is designated Pb in the following. In case A, any other page is selected, for example that with the oldest time stamp, and designated Pg. In case B, the younger one of the two pages with the same association address is designated Pg.

Subsequently, the page Pb is erased. Prior to erasing the page Pb, however, the page Pg is marked. Preferably, the page Pg is marked once more after erasing the page Pb. Then the information of the additional disturb is introduced into the page Pg. The information on the disturb is introduced into the page Pg by copying it into the erased page Pb with a corresponding new time stamp after erasing the page Pb. After this copying process, the old, double marked page Pg is erased.

One advantage of the present invention is that a sector is repaired in such a way that information on occurred disturbs cannot be lost at any time and, in particular, information on disturbs cannot be lost even by an accidental or deliberately caused failure of the power supply. This even applies in the case of a multiple tearing and even for multiple tearing during a tearing service.

Another advantage of the present invention is that it is compatible with the described UCP concept. Furthermore, the present invention does not require any change in the architecture of the cell field of the memory and/or a sector and its pages.

The present invention is implementable both as device and as method or computer program.

Figure 1:
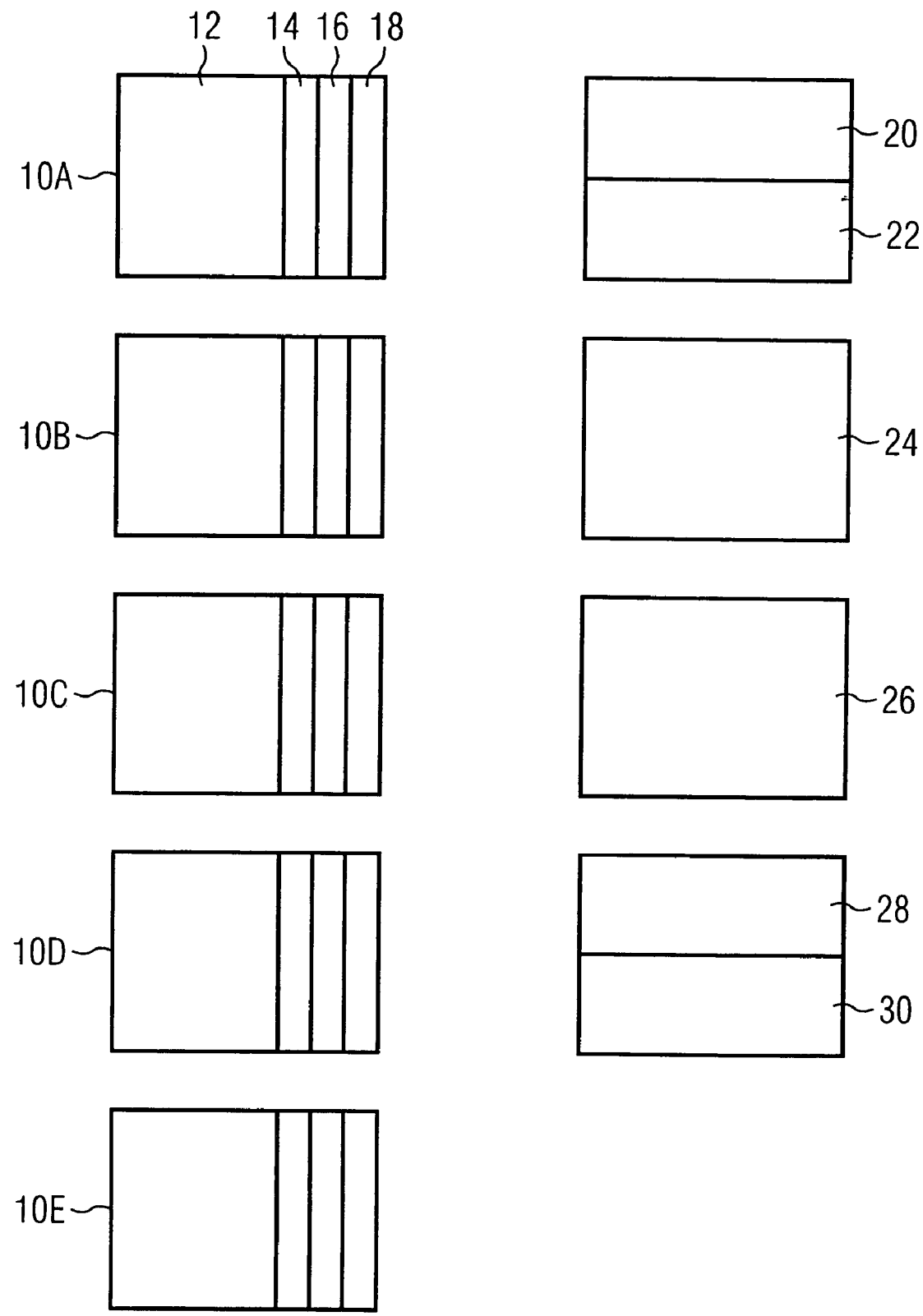
FIG. 1 shows a schematic representation of a memory according to a preferred embodiment of the present invention.

FIG. 1 is a schematic representation of a memory according to a preferred embodiment of the present invention. The memory comprises a plurality of pages $10a$, $10b$, $10c$, $10d$, $10e$, each including the same number of memory cells for storing data. In other words, the memory includes a plurality of memory cells organized in a plurality of pages $10a$, ..., $10e$. Each page $10a$, ..., $10e$ includes a data section 12 for storing data and/or information, which may be written and read by a circuit arranged external to the memory, but possibly on the same chip, for example a processor. Furthermore, each page $10a$, ..., $10e$ includes an association block 14 for storing an association address defining the association of the physical pages $10a$, $10e$ with memory addresses of the memory. Furthermore, each page $10a$, ..., $10e$ includes a marking section 16 including at least one and preferably at least two memory cells for storing marking bits. Each page $10a$, ..., $10e$ further includes a time stamp memory section 18 for storing a time stamp.

As a first example, assume that the memory includes five pages $10a$, ..., $10e$, as illustrated. Let the data section 12 of each page $10a$, ..., $10e$ include eight rows, each having eight bits or one byte. The association block 14, the marking section 16 and the time stamp memory section 18 are located in a ninth row. In a regular operating mode, data is stored in the data sections 12 of four of the pages $10a$, ..., $10e$. The data sections 12 of these four pages are associated with addresses of the address section of the sector. A further one of the pages $10a$, ..., $10e$ is empty. Its data section 12 is associated with none of the addresses of the address section of the sector. The pages storing the data are also referred to as data pages, the empty page is referred to as spare page. As described in the following, different ones of the five physical pages will be the spare page at different times during the operation of the memory. In other words, a page that, up to then, had been a data page is erased in the case of certain events and thus becomes the spare page, while the previous spare page is written to and thus becomes a data page.

In addition to data, each page contains an association address, a time stamp and marking bits. The association address serves for the unique association of the data section 12 and its memory cells with addresses of the address section and/or address space of the sector.

The time stamp is a number giving the level of a disturb counter and/or counter at the time of writing and/or writing to the page. The counter is increased for every write operation in the sector. The difference between the current value of the counter and the time stamp of a page indicates how many write operations in the sector the page has experienced since it was last written to. Since, as mentioned above, each write operation in the sector also disturbs the pages of the sector that are not directly involved in the write operation, a page has to be re-written when the number of the write operations since the page was last written to exceeds a predetermined threshold.

While the memory is provided with electric power, the value of the counter is preferably stored in a volatile memory and incremented for each write operation in the sector. After a failure of the supply power, the value of the counter stored in a volatile way is lost. What is done first after turning on the supply power is therefore to determine the highest value time stamp of the pages of the sector. This highest value time stamp is than loaded into the counter as starting value.

A page that does not comprise any memory cells containing other values than 0 may unambiguously be identified as spare page, because a data page comprises at least one time stamp different from 0. The spare page therefore does not have to be marked or identified in any other way.

The association address has to include two bits for the unique addressing of four data pages.

Furthermore, let the marking section 16 include two memory cells for storing, all in all, two marking bits. The association block 14 and the marking section 16 together thus include five bits and can thus be accommodated in one row. A memory section for storing the time stamp is preferably selected so large that it is sufficient for all counter values within the life of the memory. An EEPROM, for example, typically operates error-free to at least $10^4$ to $10^6$ storing operations per page. Since at the most half of the storing operations of a sector can be directed at a particular page, the sector has to be deactivated at a counter level of $2 \cdot 10^4$ or $2 \cdot 10^6$, respectively, for safety reasons, to prevent a malfunction. Therefore, 15 or 21 bits, respectively, are required for storing the disturb counter value or the time stamp.

Altogether, one page $10a$, ..., $10e$ thus includes eleven rows of 8 bits each, wherein, as described above, eight rows are associated with the data section 12, and the association block 14 and the marking section 16 are located in the ninth row. In the case of a life expectancy of $10^4$ storing operations per page, the tenth and the eleventh row contain the time stamp. In the case of a life expectancy of $10^6$ storing operations per page, the bits of the ninth row which are not occupied by the association block 14 and the marking section 16 further contain three bits of the time stamp.

A fifth one of the five pages $10a$, ..., $10e$ is empty in a regular operating mode and serves as spare page. If data within one of the four data pages are to be updated and/or changed, the updated and/or changed data, the association address of the page to be changed and a new time stamp are written to the spare page. Subsequently, the page with the outdated data content is erased and thus becomes the new spare page.

In a further numerical example, a sector includes 33 pages $10a$, ..., $10e$, 32 pages of which are respectively associated with the address section of the sector by association addresses stored in their association blocks 14. A $33^{rd}$ page is an empty page or a spare page in a regular operating mode, i.e. as long as the data content of one of the data pages is not being changed at that moment. In this numerical example, let the data section 12 of each of the pages $10a$, ..., $10e$ include 64 bytes in 16 rows, each having four bytes. The association block 14 includes five bits for storing addresses between 0 and 31, by which each of the 32 data pages of the 33 pages 10a, ..., 10e is uniquely addressable. The marking section 16 again includes two bits for storing two marking bits. These altogether eight bits are preferably located within a 17$^{th}$ row of each page 10a, ..., 10e. The time stamp is stored in further bits of the 17$^{th}$ row.

In addition to the pages 10a, ..., 10e, a sector includes means 20 for determining generation information from the generation information of the pages 10a, ..., 10e. This generation information preferably includes the time stamp already mentioned. For each writing of a page, the page gets a time stamp that is put in the page in the form of a number. The time stamp is the current value of a counter at the time of writing a page, which is incremented for each writing of a page. After a reset or after turning on a power supply, the means 20 for determining generation information determines the highest time stamp and/or the time stamp with the largest value among the time stamps of the pages 10a, ..., 10e. For this purpose, the means 20 reads out the time stamps of all pages 10a, ..., 10e or alternatively the time stamps of all data pages 10a, ..., 10e and forms their maximum.

The determined generation information and/or the determined maximum time stamp of the pages 10a, ..., 10e is passed on to providing means 22 for providing new generation information based on the determined generation information. The providing means 22 receives the determined time stamp from the means 20 and increments it. The incremented time stamp is then available as new generation information for a subsequent writing of a page.

A page determination means 24 is designed to determine one of the pages 10a, ..., 10e comprising an inconsistency. An inconsistency may be a contradiction between a data content and an error correcting code of a page. Such a contradiction stems from a preceding incomplete writing or erasing of a page in which part of the bits of the page have already been programmed and/or erased, while other bits are still unchanged with respect to an original state.

In a UCP EEPROM, all bits which are to have a logical 1 are set in parallel and simultaneously when writing a page, and all bits of the page are erased and/or set to a logical 0 in parallel or simultaneously when erasing. In fact, the writing or erasing of a memory cell is a continuous process in which, for example, the potential of a floating gate is continuously transferred from a first state representing a first binary character to a second state representing a second binary character. Due to device scattering, statistical fluctuations etc. the transition between a state still representing the first binary character and a state already representing the second binary character occurs at a point in time that is not exactly predictable. In fact, if a plurality of memory cells is programmed or erased in parallel and simultaneously, the transition between the two states therefore does not occur completely simultaneously in all memory cells. By interrupting the power supply, the storing or erasing may be interrupted at any point in time. This causes the described state in which part of the memory cells and/or bits still has an old value, while another part of the bits already has the new value.

Another inconsistency of a page which is recognized and/or detected by the page determination means 24 is a match of association addresses of two pages. That page of the two pages having the same association address and the older and/or smaller time stamp is determined to be inconsistent. Such a state of a sector with two pages having the same association addresses can occur, for example, when the power supply fails or is turned off at a late time of writing a page with updated data content or at an early time of erasing a page with outdated data content. In this case, it is also possible that two pages have the same association address, but that the content of one of the two pages contradicts the error correcting code of the page. The page determination means is preferably designed so that, in this case, it determines that page as being inconsistent whose contents contradict its error correcting code, irrespective of the fact whether the page carries the younger or the older time stamp.

A selection means 26 is designed to select a further one of the pages 10a, ..., 10e. In the case of two pages with the same association address, preferably the non-inconsistent one of the two pages is selected. In other cases, any other page is selected. Preferably, the selection means 26 is designed so that, in this case, it selects the oldest page 10a, ..., 10e and/or the page 10a, ..., 10e having the oldest time stamp.

The selection means 26 is further preferably designed to mark the selected page by setting a first marking bit.

A reading means 28 is designed to read the contents of a page 10a, ..., 10e and to deposit them in a volatile memory. This reading and depositing is preferably done in parallel and simultaneously for all bits of the page 10a, ..., 10e via a corresponding number of parallel bit lines. Preferably both the contents of the data section 12 and the contents of the association block 14 are copied from the page 10a, ..., 10e into the intermediate memory.

A writing means 30 is designed to write and/or copy data from the intermediate memory into one of the pages 10a, ..., 10e. The writing means 30 and the reading means 28 thus access the same intermediate memory. Preferably, all bits of a page 10a, ..., 10e are written simultaneously, i.e. both data of the data section 12 and the association address in the association block 14, marking bits in the marking section 16 and a time stamp.

The means 20, the providing means 22, the page determination means 24, the selection means 26, the reading means 28 and the writing means 30 are fixedly associated with a sector and thus exist multiple times within a memory device corresponding to the number of the sectors. Alternatively, they may be switchably associated with one of several or one of all sectors of a memory device.

Figure 2A:
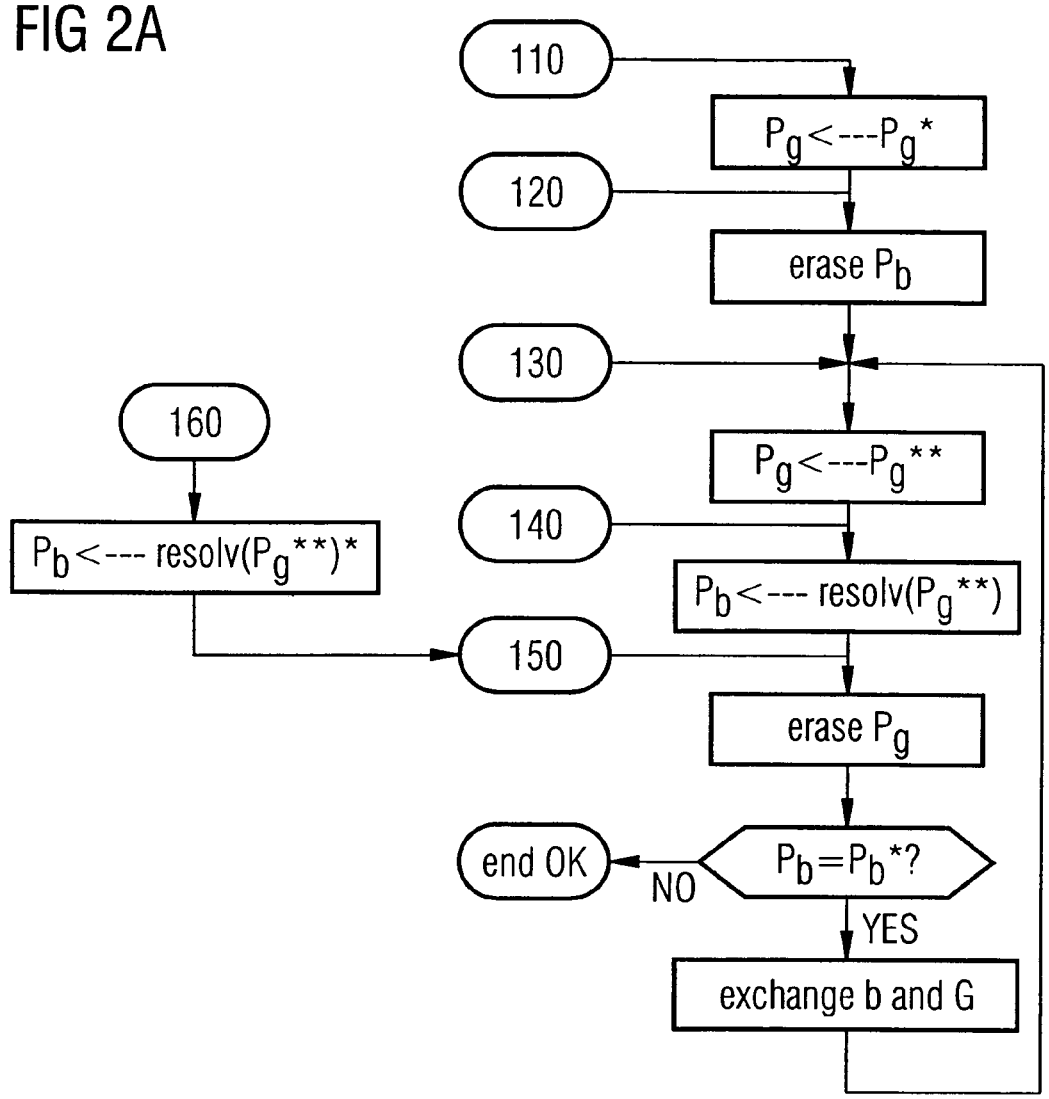
FIGS. 2A, 2B show schematic flow charts of a method according to a preferred embodiment of the present invention.
Figure 2B:
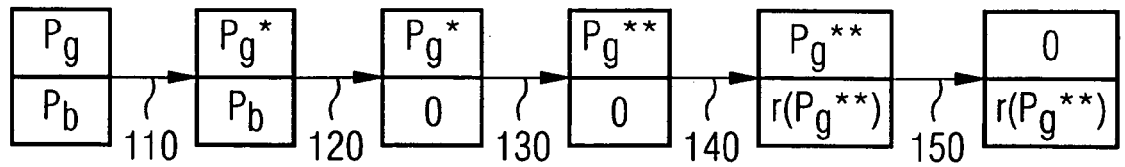

Subsequently, the operation of the inventive memory illustrated above with respect to FIG. 1 will be explained in more detail with respect to FIG. 2A. The effects of the illustrated steps on the two pages involved are illustrated in FIG. 2B.

Every time a supply power is turned on, the means 20 reads the time stamps of all pages 10a, ..., 10e and determines from them the youngest time stamp and/or the time stamp with the highest numerical value. Alternatively, it is not the youngest time stamp that is determined, but the second youngest or any other time stamp. Preferably, however, it is not the generation information and/or the time stamp indicating the oldest programming time of the pages 10a, ..., 10e that is determined.

Furthermore, after every turn-on, the page determination means 24 determines simultaneously with, prior to or after the determination of the youngest time stamp whether one of the pages 10a, ..., 10e comprises an inconsistency and/or determines, if necessary, the inconsistent page. An inconsistent page is, as mentioned above, a page with a contradiction between its content and its error correcting code or an older one of two pages having the same marking address.

A further page is selected from the pages $10a, \ldots, 10e$, i.e. the non-inconsistent page in the case that there are two pages having the same marking address, and otherwise any page $10a, \ldots, 10e$ which is not the inconsistent page and preferably the oldest page $10a, \ldots, 10e$.

The determined page which includes an inconsistency is designated $P_b$ in the following, the further and/or selected page is designated $P_g$.

In step 110, the further page $P_g$ is marked by setting a marking bit. The bit preferably used as the marking bit is a bit of the marking section or an otherwise unused bit from the association block 14 or another previously unused bit of the page $P_g$, which, in normal operation, is always in the erased state and/or has the value 0 and is only used in the tearing service described herein. This marking bit is post-programmed and thus related and/or set to the value 1. All other bits of the page remain the same. The set marking bit is also referred to as tearing flag (TF1). The page marked by the tearing flag TF1 is referred to as $P_g^*$.

This action is allowed by the UCP concept. In particular, an individual bit may be set to the value 1 also in a UCP EEPROM. For this, a mask is used which comprises a 1 at the place of the bit to be set and a 0 at all other places. Alternatively, a map of the further page is used as mask, wherein, however, the marking bit is set. This mask is then copied into the further page to be marked. A 0 of the mask does not cause any change of the corresponding bit of the page, irrespective of whether the corresponding bit of the page previously contained a 0 or a 1. A 1 of the mask causes a setting of the corresponding bit of the page.

Subsequently, the determined and/or inconsistent page $P_b$ is erased in step 120.

While conventionally tearing or a different failure of the supply power after erasing the inconsistent page $P_b$ would have resulted in the information on an incomplete write operation, due to which the described tearing service has to be performed, being lost, now the set marking bit and/or tearing flag TF1 signals that the sector was in a tearing service. Inventive method steps by which the tearing service is then continued after the supply power has been turned on again will be described in more detail below.

After erasing the inconsistent page $P_b$, the marked page $P_g^*$ is marked once more in step 130 by setting a further marking bit. A further unused bit similar to the tearing flag TF1 is used as further marking bit. This further marking bit is also referred to as further tearing flag TF2. The further marking bit is also erased in normal operation and is only set during the tearing service after erasing 120 the inconsistent page Pb. The page marked by the marking bit and/or tearing flag TF1 and the further marking bit and/or tearing flag TF2 is referred to as $P_g^{**}$.

In a next method step 140, the double marked page $P_g^{}$ is copied into the erased page, i.e. into the old page $P_b$. Here, the contents of the data section 12 and the association block 14 are copied, the marking bits in the marking section 16, however, are not. Furthermore, the incremented time stamp provided by the providing means 22 is simultaneously written to the old page $P_b$ in step 140. The double marked page $P_g^{}$ with the incremented time stamp is referred to as resolvent resolv($P_g^{**}$).

The step 140 of copying is preferably done by reading and depositing the contents of the double marked page $P_g^{}$ in a (volatile) intermediate memory and subsequently writing the contents of the double marked page $P_g^{}$ from the intermediate memory to the old page $P_b$. The erasing of the marking bits and the introducing of a new time stamp are readily done by manipulating the intermediate memory after reading and prior to writing.

By the incremented time stamp, the information on the disturb caused by the writing is now introduced in the sector.

In step 150, the double marked page $P_g$ is now erased. Thus, a new spare page is generated and the sector is in a valid state again.

The tearing service is completed after erasing the double marked page $P_g^{}$. In the case of a UCP EEPROM, the tearing service preferably comprises the steps 120, 150 of erasing, because, when programming a page, bits and/or memory cells can only be set and/or pulled from 0 to 1, but cannot be erased and/or reset from 1 to 0. In the case of another memory type also permitting resetting a bit and/or the value of a memory cell from 1 to 0, when programming, the steps 120 of erasing the inconsistent page $P_b$, 130 of further marking and 150 of erasing of the double marked page $P_g^{}$ are preferably omitted and/or skipped.

If the supply power fails during the step 120 of erasing the inconsistent page $P_b$, this may be detected, after the supply power has been turned on again, by the fact that the sector comprises a marked page $P_g^*$. In this case, the inventive memory simply continues the tearing service. First, that generation information of the generation information of the pages $10a, \ldots, 10e$ is determined again which indicates the youngest, second youngest or also another programming time. Further, that page $P_b$ is determined which includes an inconsistency. Subsequently, the tearing service is continued as described above from the step 120 of erasing the inconsistent page $P_b$.

In addition to the method steps described above, the flow diagram represented in FIG. 2A comprises further method steps which are performed when the tearing service is again interrupted during the step 140 of copying or at the beginning of the step 150 of erasing (tearing during the tearing service). When the step 150 of erasing is interrupted at a later time, when part of the memory cells and/or bits of the double marked page $P_g^{}$ has already been erased and there is thus a contradiction between the contents of the page and its error correcting code, the method can be completed by simply continuing the erasing of the double marked page $P_g^{}$ after the supply power has been turned on again, if the two marking bits are still set. Otherwise, the incompletely erased, previously double marked page will trigger a new performance of a complete tearing service according to one of the methods described above.

If, after turning the supply power on again, a double marked page $P_g^{}$ is determined, the method is continued as follows. Before or after determining the double marked page, the generation information of the generation information of the pages $10a, \ldots, 10e$ that preferably indicates the youngest programming time of the pages $10a, \ldots, 10e$ is determined, as in the methods described above. First, the programming of the resolvent resolv($P_g^{}$) is completed, i.e. the double marked page $P_g^{}$ is again copied into the page $P_g$, wherein, as described above, first the contents of the double marked page $P_g^{}$ are read into an intermediate memory and are written into the page $P_b$ from there. Preferably by manipulating the contents of the intermediate memory, the further marking bit and/or the tearing flag TF2 are erased, and a new time stamp is inserted. The new time stamp is based on the youngest time stamp of the pages $10a, \ldots, 10e$ determined after turning on the supply power, and/or is obtained from it by incrementing.

Subsequently, the double marked page $P_g^{}$ is erased in step 150**. After that, there is a check whether the page $P_b$ comprises a set marking bit TF1 ($P_b=P_g^*$?). At the end of the regular and undisturbed tearing services described above, this is not the case. Therefore the tearing service is terminated as described above.

If, however, the tearing service was resumed with completing the programming 160 of the resolvent, the page $P_b$ is single marked ($P_b=P_g^*$). Thereupon the steps 130 of marking, 140 of copying and 150 of erasing are repeated for exchanged pages $P_b$, $P_g$. During this new repeating, the time stamp is again incremented to introduce the information on the disturb of the memory pages into the sector. In the worst case, an attacker can thus force an infinite loop. This is no problem, however, since all disturbs are counted.

The above embodiments can be varied in several respects. For example, a time stamp and/or a disturb counter may be used that is incremented with each write operation or is decremented with each write operation. Furthermore, the above embodiments assumed that, when erasing bits and/or memory cells, they are set from 1 to 0, and, when storing, they are set from 0 to 1, if applicable. A reverse association in which erased memory cells have the value 1 and, when programming, memory cells are set to the value 0, if applicable, is equivalent with respect to the present invention.

The association block 14, the marking section 16 and the time stamp memory section 18 are preferably integrated in the respective page and its architecture, as described above. Alternatively, the association block 14 or the marking section 16 or the time stamp memory section 18 is associated with the page, but is located spatially separate from its memory cells, or is centrally united for all pages at a location of the sector.

The present invention is advantageously applicable not only to UCP EEPROMs, but also to other EEPROMs or memories of other types.

The present invention is implementable both in the form of a method and in the form of a device or a computer program. The inventive method is executable both by or by means of the device illustrated above with respect to FIG. 1 and by another device or a computer, when a computer program with program code runs on the computer for performing the inventive method.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A device for treating a state, resulting from incomplete writing or erasing of data, of a memory having memory cells organized in a plurality of pages with which there is respectively associated generation information indicating a programming time of the page, comprising:

a unit for determining generation information from the generation information of the plurality of pages to obtain determined generation information, wherein the determined generation information indicates a programming time of the plurality of pages which is not the oldest programming time;

a page determination unit for determining a page from the plurality of pages which includes an inconsistency to obtain a determined page;

a selection unit for selecting a further page from the plurality of pages to obtain a selected page;

a marking unit for marking the selected page to obtain a marked page;

a providing unit for providing new generation information based on the determined generation information;

a reading unit for reading data from the marked page; and a writing unit for writing the data read from the marked page and the new generation information to the determined page.

2. A memory comprising:

a plurality of pages, each comprising memory cells for storing data and generation information associated with the page; and a device for treating a state, resulting from incomplete writing or erasing of data, of a memory having memory cells organized in a plurality of pages with which there is respectively associated generation information indicating a programming time of the page, comprising a unit for determining generation information from the generation information of the plurality of pages to obtain determined generation information, wherein the determined generation information indicates a programming time of the plurality of pages which is not the oldest programming time; a page determination unit for determining a page from the plurality of pages which includes an inconsistency to obtain a determined page; a selection unit for selecting a further page from the plurality of pages to obtain a selected page; a marking unit for marking the selected page to obtain a marked page; a providing unit for providing new generation information based on the determined generation information; a reading unit for reading data from the marked page; and a writing unit for writing the data read from the marked page and the new generation information to the determined page.

3. A method for treating a state, resulting from incomplete writing or erasing of data, of a memory having memory cells organized in a plurality of pages, wherein each page comprises generation information indicating a programming time of the page, the method comprising the steps of:

determining generation information from the generation information of the plurality of pages to obtain determined generation information, wherein the determined generation information indicates a programming time of the plurality of pages which is not the oldest programming time;

determining a page from the plurality of pages which includes an inconsistency to obtain a determined page, wherein the inconsistency results from the incomplete writing or erasing of data;

selecting a further page from the plurality of pages to obtain a selected page;

marking the selected page to obtain a marked page;

providing new generation information based on the determined generation information;

reading data from the marked page; and writing the data read from the marked page and the new generation information to the determined page.

4. The method of claim 3, wherein the determined generation information indicates the youngest programming time of the plurality of pages.

5. The method of claim 3, wherein each of the plurality of pages comprises an address memory space for storing an address associated with the page from a plurality of addresses, wherein, in a state of the memory not resulting from incomplete writing or erasing, each of the plurality of addresses is associated with only one of the plurality of pages, and wherein the step of determining a page including an inconsistency comprises a step of determining a page whose data contents do not match its error correcting code or whose associated address is further associated with a page whose generation information indicates a later programming time.

6. The method of claim 3, wherein the generation information of each page includes a time stamp, wherein the time stamp represents the level of a write operation counter for counting write operations at the time of the last preceding writing of the respective page.

7. The method of claim 3, wherein the step of marking the selected page includes setting a marking bit associated with the further page.

8. The method of claim 3, further comprising the step of:
erasing the determined page prior to writing the data read from the marked page and the new generation information to the determined page.

9. The method of claim 8, further comprising the step of:
marking the marked page to obtain a double marked page after erasing the determined page and prior to writing.

10. The method of claim 3,
wherein the step of reading includes copying the data from the marked page into an intermediate memory,
wherein the step of providing the new generation information includes writing the new generation information to the intermediate memory, and
wherein the step of writing the data read from the marked page and the new generation information includes a step of copying the read data and the new generation information from the intermediate memory into the determined page.

11. The method of claim 10, wherein the step of copying the data and the new generation information includes a parallel transfer of the data and the generation information via a plurality of parallel lines, wherein one of the plurality of parallel lines is associated with each bit of the data and the generation information.

12. The method of claim 3, further comprising the step of:
erasing the marked page after reading the data from the marked page.

13. The method of claim 3, wherein the step of selecting the further page includes a step of selecting the page whose generation information indicates the oldest programming time of the plurality of pages as the selected page.

14. A method for treating a state, resulting from incomplete erasing of a page of a memory, of a memory having memory cells organized in a plurality of pages, each page being associated with generation information indicating a programming time of the page and comprising a marking bit, the method comprising the steps of:
determining a page whose marking bit is set;
determining generation information from the generation information of the plurality of pages to obtain determined generation information, wherein the determined generation information indicates a programming time of the plurality of pages which is not the oldest programming time;
determining a page including an inconsistency to obtain a determined page, wherein the inconsistency results from the incomplete erasing of data;
providing new generation information based on the determined generation information;
erasing the page including an inconsistency;
reading data from the marked page; and
writing the data read from the marked page and the new generation information to the determined page including the inconsistency.

15. A method for treating a state, resulting from incomplete writing or erasing of data, of a memory having memory cells organized in a plurality of pages, wherein each page comprises generation information indicating a programming time of the page, and wherein each page comprises a first marking bit and a second marking bit indicating the incomplete writing or erasing, the method comprising the steps of:
determining a marked page whose second marking bit is set;
determining generation information from the generation information of the plurality of pages to obtain determined generation information, wherein the determined generation information indicates a programming time of the plurality of pages which is not the oldest programming time;
determining a page including an inconsistency to obtain a determined page, wherein the inconsistency results from the incomplete writing or erasing of data;
providing new generation information based on the determined generation information;
reading data from the marked page whose second marking bit is set;
writing the data read from the marked page whose second marking bit is set and the new generation information to the determined page;
setting the first marking bit of the determined page;
providing further new generation information based on the new generation information;
reading data from the determined page after writing the data read from the marked page whose second marking bit is set to the determined page and after setting the first marking bit; and
writing the data read from the determined page and the further new generation information to the marked page whose second marking bit is set.

16. The method of claim 15, further comprising the step of:
erasing the marked page whose second marking bit is set after writing the data read from the marked page whose second marking bit is set to the determined page.

17. The method of claim 15, further comprising the step of:
erasing the determined page after writing the data read from the determined page to the marked page whose second marking bit is set.

18. A computer program with a program code for performing a method for treating a state, resulting from incomplete writing or erasing of data, of a memory having memory cells organized in a plurality of pages, wherein each page comprises generation information indicating a programming time of the page, when the program runs on a computer, the method comprising the steps of determining generation information from the generation information of the plurality of pages to obtain determined generation information, wherein the determined generation information indicates a programming time of the plurality of pages which is not the oldest programming time; determining a page from the plurality of pages which includes an inconsistency to obtain a determined page, wherein the inconsistency results from the incomplete writing or erasing of data; selecting a further page from the plurality of pages to obtain a selected page; marking the selected page to obtain a marked page; providing new generation information based on the determined generation information; reading data from the marked page;

and writing the data read from the marked page and the new generation information to the determined page.

19. A computer program with a program code for performing a method for treating a state, resulting from incomplete erasing of a page of a memory, of a memory having memory cells organized in a plurality of pages, each page being associated with generation information indicating a programming time of the page and comprising a marking bit, when the program runs on a computer, the method comprising the steps of determining a page whose marking bit is set; determining generation information from the generation information of the plurality of pages to obtain determined generation information, wherein the determined generation information indicates a programming time of the plurality of pages which is not the oldest programming time; determining a page including an inconsistency to obtain a determined page, wherein the inconsistency results from the incomplete erasing of data; providing new generation information based on the determined generation information; erasing the page including an inconsistency; reading data from the marked page; and writing the data read from the marked page and the new generation information to the determined page including the inconsistency.

20. A computer program with a program code for performing a method for treating a state, resulting from incomplete writing or erasing of data, of a memory having memory cells organized in a plurality of pages, wherein each page comprises generation information indicating a programming time of the page, and wherein each page comprises a first marking bit and a second marking bit indicating the incomplete writing or erasing, when the program runs on a computer, the method comprising the steps of determining a marked page whose second marking bit is set; determining generation information from the generation information of the plurality of pages to obtain determined generation information, wherein the determined generation information indicates a programming time of the plurality of pages which is not the oldest programming time; determining a page including an inconsistency to obtain a determined page, wherein the inconsistency results from the incomplete writing or erasing of data; providing new generation information based on the determined generation information; reading data from the marked page whose second marking bit is set; writing the data read from the marked page whose second marking bit is set and the new generation information to the determined page; setting the first marking bit of the determined page; providing further new generation information based on the new generation information; reading data from the determined page after writing the data read from the marked page whose second marking bit is set to the determined page and after setting the first marking bit; and writing the data read from the determined page and the further new generation information to the marked page whose second marking bit is set.

* * * * *

UNITED STATES PATENT AND TRADEMARK OFFICE
CERTIFICATE OF CORRECTION

| | | |
|---|---|---|
| PATENT NO. | : 7,328,302 B2 | Page 1 of 2 |
| APPLICATION NO. | : 11/267027 | |
| DATED | : February 5, 2008 | |
| INVENTOR(S) | : Wieland Fischer et al. | |

It is certified that error appears in the above-identified patent and that said Letters Patent is hereby corrected as shown below:

In the Specification:

Column 1, line 25, "supply-power" should read --supply power--

Column 6, line 64, "Pb" should read --$P_b$--

Column 6, line 66, "Pg." should read --$P_g$.--

Column 6, line 67, "Pg." should read --$P_g$.--

Column 7, line 1, "Pb" should read --$P_b$--

Column 7, line 2, "Pb," should read --$P_b$,--

Column 7, line 2, "Pg" should read --$P_g$--

Column 7, line 3, "Pg" should read --$P_g$--

Column 7, line 3, "Pb." should read --$P_b$.--

Column 7, line 5, "Pg." should read --$P_g$.--

Column 7, line 6, "Pg" should read --$P_g$--

Column 7, line 6, "Pb" should read --$P_b$--

Column 7, line 7, "Pb." should read --$P_b$.--

UNITED STATES PATENT AND TRADEMARK OFFICE
CERTIFICATE OF CORRECTION

PATENT NO. : 7,328,302 B2
APPLICATION NO. : 11/267027
DATED : February 5, 2008
INVENTOR(S) : Wieland Fischer et al.

It is certified that error appears in the above-identified patent and that said Letters Patent is hereby corrected as shown below:

Column 7, line 8, "Pg" should read --$P_g$--

Column 7, line 36, "10a, 10e" should read --10a, . . . , 10e--

Column 7, line 65, "space-of" should read --space of--

Column 11, line 51, "Pb." should read --$P_b$.--

Signed and Sealed this

Third Day of June, 2008

JON W. DUDAS
*Director of the United States Patent and Trademark Office*